United States Patent [19]

Fisher, Jr.

[11] Patent Number: 4,752,219
[45] Date of Patent: Jun. 21, 1988

[54] WAFER SOFTLANDING SYSTEM AND COOPERATIVE DOOR ASSEMBLY

[75] Inventor: Daniel J. Fisher, Jr., Chelmsford, Mass.

[73] Assignee: BTU Engineering Corporation, North Billerica, Mass.

[21] Appl. No.: 942,040

[22] Filed: Dec. 15, 1986

Related U.S. Application Data

[63] Continuation of Ser. No. 784,836, Oct. 4, 1984, abandoned.

[51] Int. Cl.⁴ .................................................. F27D 5/00
[52] U.S. Cl. ................................. 432/253; 432/6; 432/36; 432/239
[58] Field of Search ................ 432/5, 6, 152, 253, 432/239; 414/180, 182, 152

[56] References Cited

U.S. PATENT DOCUMENTS

| | | | |
|---|---|---|---|
| 3,723,053 | 3/1973 | Myers et al. | 432/6 |
| 3,819,067 | 6/1974 | Hammond | 432/253 |
| 4,129,090 | 12/1978 | Inaniwa et al. | 432/253 |
| 4,439,146 | 3/1984 | Sugita | 432/6 |
| 4,468,195 | 8/1984 | Sasaki et al. | 432/36 |
| 4,484,538 | 11/1984 | Sankozy et al. | 432/253 |
| 4,543,059 | 9/1985 | Whang et al. | 432/239 |

Primary Examiner—Henry C. Yuen
Attorney, Agent, or Firm—Weingarten, Schurgin, Gagnebin & Hayes

[57] ABSTRACT

A wafer softlanding system and cooperative door assembly are disclosed for gently and reliably loading and unloading a batch of wafers onto and off of the floor of a processing furnace tube. The disclosed softlanding system is coupled to a wafer receiving paddle and is operable to both linearly move the paddle as a whole in Z either upwardly or downwardly and to selectively rotatably move the paddle so that it tilts about an axis as it is moved linearly up and down. A door assembly is disclosed that includes a resiliently mounted furnace closure that is operative to provide a self-seating action at the mouth of the processing furnace tube. The door assembly includes in one embodiment a vacuum door closure and in another embodiment an atmospheric process door closure. In both embodiments, the closure members are readily releasable to provide for each of interchangeability, maintenance, and differential door size accommodation.

17 Claims, 7 Drawing Sheets

WAFER SOFTLANDING SYSTEM AND COOPERATIVE DOOR ASSEMBLY

This application is a continuation of application Ser. No. 784,836, filed Oct. 4, 1984, now abandoned.

FIELD OF THE INVENTION

This invention is directed to the field of semiconductor wafer processing, and more particularly, to a novel wafer softlanding system and cooperative door assembly.

BACKGROUND OF THE INVENTION

Semiconductor wafers are batch processed in the thermal reaction chambers of one or more processing furnace tubes to form various thin-films and other structures thereon during the several phases of the integrated circuit fabrication process. The wafers are typically loaded into so-called boats provided therefor, and a boat loading mechanism is provided for inserting and removing plural wafer loaded boats operatively coupled to the boat loading mechanism into and out of the thermal reaction chambers. The boat loading mechanisms are called upon to be as reliable as is practicably possible, so that system throughput, and consequent revenue generation, are not thereby compromised. As the dimensions of the microstructures formed on the wafers become smaller, the risk of batch contamination proportionately increases making even comparatively small quantities of particulates generated during the loading and unloading procedures approach unacceptable limits. In view of the extremely small dimensions of the microstructures now capable of being fabricated by todays technology, such boat loading mechanisms then are further called upon to operate in such a way that particulate generation is either eliminated or constrained to a level sufficiently low to prevent the possibility of contaiminating the wafers being processed in the one or more processing furnace tubes.

SUMMARY OF THE INVENTION

The novel softlanding system and cooperative door assembly of the present invention is operative to produce little if any particulates, and has such a construction as to be both reliable in operation and readily maintainable. The present invention thus achieves a high system throughput, and makes possible the micro-fabrication of intended structures of very small dimensions on plural wafers, in one or more processing furnace tubes, in a manner that is substantially free from the deleterious effects of particulate generation.

The disclosed softlanding system includes a cantilevered paddle. An X-actuator is coupled to the paddle for moving plural wafer-loaded boats placed on the free end of the paddle into and out of the thermal reaction chamber of a processing furnace tube. A combination Z and $\theta$ actuator assembly coupled to the supported end of the cantilevered paddle is selectively operative in a load mode and in an unload mode to so move the paddle in the Z direction and in the $\theta$ direction as to gently place and remove the plural boat-loaded wafers onto and off of the floor of the thermal reaction chamber. In the preferred embodiment, the Z and $\theta$ motions are selected such that the paddle approaches and departs from the floor of the processing furnace tube at an oblique angle during softlanding and liftoff. Any particulate generation that would otherwise arise from the sticking of the plural wafer loading boats to the floor of the thermal reaction chamber thereby is circumvented. A door assembly is disclosed that is cooperative with the softlanding system to provide a closure at the mouth of the thermal reaction chamber except during the load and unload modes. Means are disclosed for removably mounting the closure to the door assembly, which therewith allows its ready repair and replacement, and the capability to accept doors of varying physical dimensions. Resilient means are disclosed cooperative with the removable mounting means for providing a self-seating action thereof. A vaccum door closure and an atmospheric door closure are disclosed.

BRIEF DESCRIPTION OF THE DRAWINGS

These and other features and advantages of the present invention will become apparent as the invention becomes better understood by referring to the following solely exemplary and non-limiting detailed description of a preferred embodiment thereof, and to the drawings, wherein:

FIG. 8 illustrates in FIG. 8A a top plan view, partially in section, of the cooperative door assembly of the invention having an atmospheric door closure, and illustrates in 8B a fragmentary sectional view illustrating a vacuum door closure.

DETAILED DESCRIPTION OF THE PREFERRED EMBODIMENT

Figure 1:
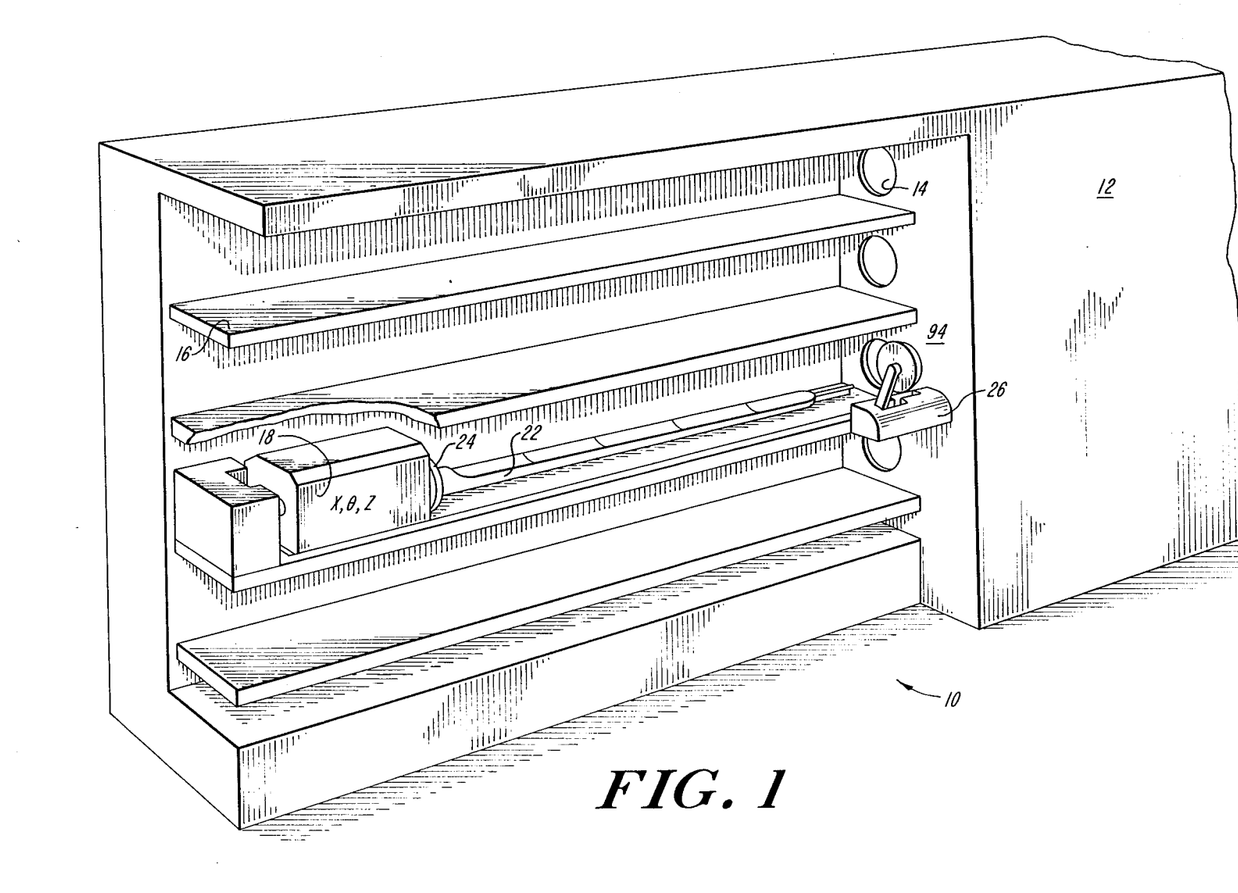
FIG. 1 is a perspective view illustrating an exemplary furnace system having the novel wafer softlanding system and cooperative door assembly of the present invention.

Referring now to FIG. 1, generally designated at 10 is a furnace system having the wafer softlanding system and cooperative door assembly of the present invention. The system 10 includes a furnace generally designated 12 having a plurality of vertically stacked processing furnace tubes, not specifically shown, that are accessible via a corresponding one of plural mouths 14. A vertically stacked array of load shelves 16, corresponding in number to the number of processing furnace tubes, are provided in longitudinal alignment with the processing tubes and confronting a corresponding mouth 14 thereof. An X, $\theta$, and Z moveable wafer softlander 18 to be described, and cooperative electronics 20, are provided on each of the load shelves 16 of the furnace 12, one being specifically illustrated. A cantilevered paddle 22 is mounted to each of the wafer softlanders 18, and a scavenger shield 24 is mounted thereto adjacent the supported end of the cantilevered paddle 22. A door assembly 26 to be described is mounted to the furnace 12 adjacent corresponding ones of the mouths 14 of the several processing furnace tubes.

Figure 2A:
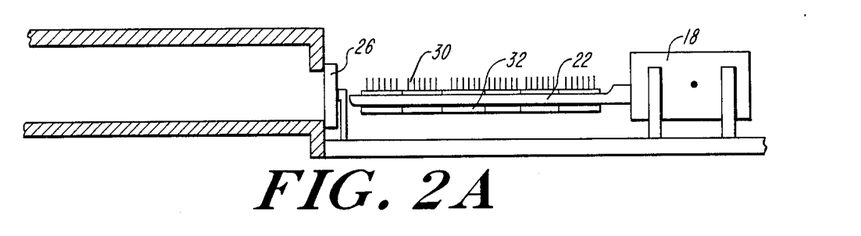
FIG. 2 illustrates in FIGS. 2A–2E thereof pictorial side views useful in explaining the operation of the wafer softlanding system and cooperative door assembly of the present invention.

In operation and referring now to FIG. 2A, plural wafers 30 are placed on the cantilevered paddle 22 of the wafer softlander 18 for processing in the associated furnace tube. The wafers 30 are supported in a quartz member 32 of any suitable design that receives the several wafers and that receives the free end of the paddle 22. Prior to and after processing, the door assembly 26 is in its closed condition as illustrated.

Figure 2B:
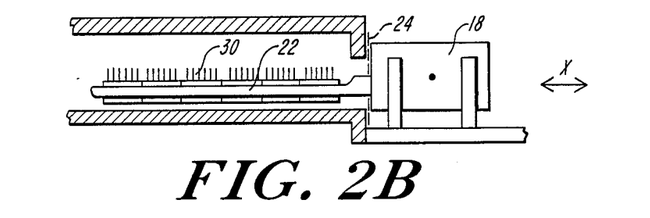

After the door 26 is moved into its open condition out of the mouth of the associated processing furnace tube, the wafer softlander 18 moves in a direction designated "X" for inserting the plural wafers 30 into the processing tube as shown in FIG. 2B. As the softlander 18 moves in the X direction, of the cantilevered paddle 22 therewith moves into the thermal reaction chamber of the processing furnace tube, and no particulates or other contaminates are thereby generated. The scavenger shield 24, illustrated dashed in FIG. 2B, is then in abutting relation with the mouth of the processing tube. A scavenger manifold, not shown, is typically provided intermediate the mouths 14 and the several processing furnace tubes, and the shields 24 help maintain a desired gas environment during loading and unloading.

Figure 2C:
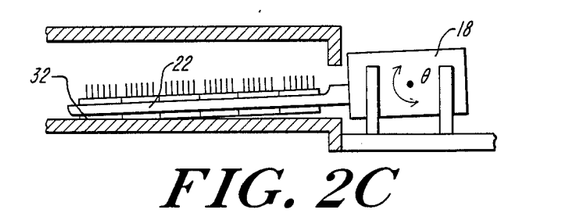

As shown in FIG. 2C, the wafer softlander 18 then moves in $\theta$ and in Z such that the cantilevered paddle 22 changes its pitch as it moves downwardly. In the presently preferred embodiment, the pitch is changed such that its free end is more downwardly inclined than its supported end during controlled descent, although, as appears more fully below, the softlander 18 is selectively operable to pitch the paddle 22 in, among other modes, the converse manner. The resulting motion of the cantilevered paddle 22 is such that the end of the support 32 remote from the softlander 18 softly touches down on the floor of the processing furnace tube before the end thereof adjacent the softlander 18.

Figure 2D:
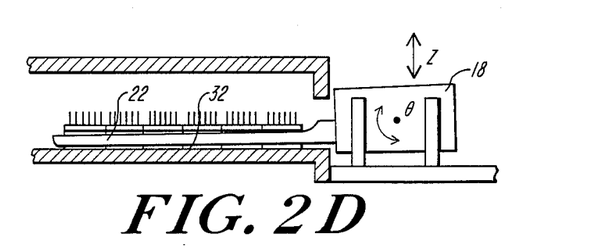

As shown in FIG. 2D, with continued controlled $\theta$ and Z movement of the paddle, the entire surface of the support 32 lands softly on the confronting wall of the floor of the processing furnace tube. As will be appreciated, the support 32 does not scrape along the floor of the processing tube during its controlled descent so that particulate generation thereby is either wholly eliminated or kept well within prescribed bounds.

Figure 2E:
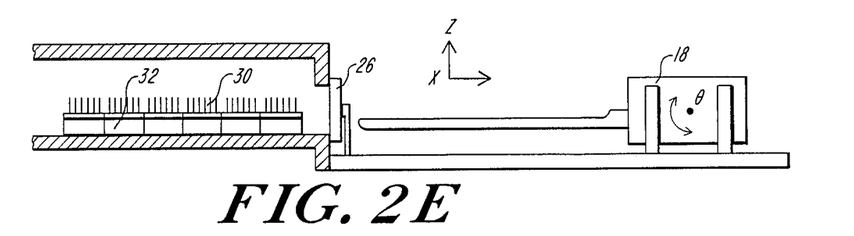

As shown in FIG. 2E, the softlander 18 then moves the paddle along the X axis, preferably while executing a Z, $\theta$ motion that is the reverse of that described above in connection with the description of FIGS. 2B-2D, out of both the support 32 and the furnace processing tube without touching the floor of the processing furnace tube. The door 26 is then moved into its closed condition, and the wafers 30 are processed in the furnace tube to form the intended structures thereon.

After processing of each batch of wafers 30, the door is moved into its opened condition, and the softlander 18 is operative to move the paddle in X, $\theta$, and Z so as to be received in the support 32 as shown in FIG. 2D. Thereafter, the softlander is operative to so move the paddle in $\theta$ and in Z that the support 32 is gently lifted off of the floor of the processing furnace tube, with the end thereof proximate the softlander 18 being lifted off before the free end thereof as illustrated in FIG. 2C. It will be appreciated that the pitch of the paddle is able to break any sticking of the support 32 to the floor of the furnace without generating any significant particulates therebecause. With continued $\theta$ and Z motion, the paddle, and therewith the wafers 30 and support 32, are moved above the floor of the processing furnace tube as illustrated in FIG. 2B. Thereafter, the softlander moves in X, and therewith the batch of processed wafers on the paddle 22 are removed from the furnace as shown in FIG. 2A. It will be appreciated that the same or another process is then repeated on the same or on another batch of wafers.

Figure 3:
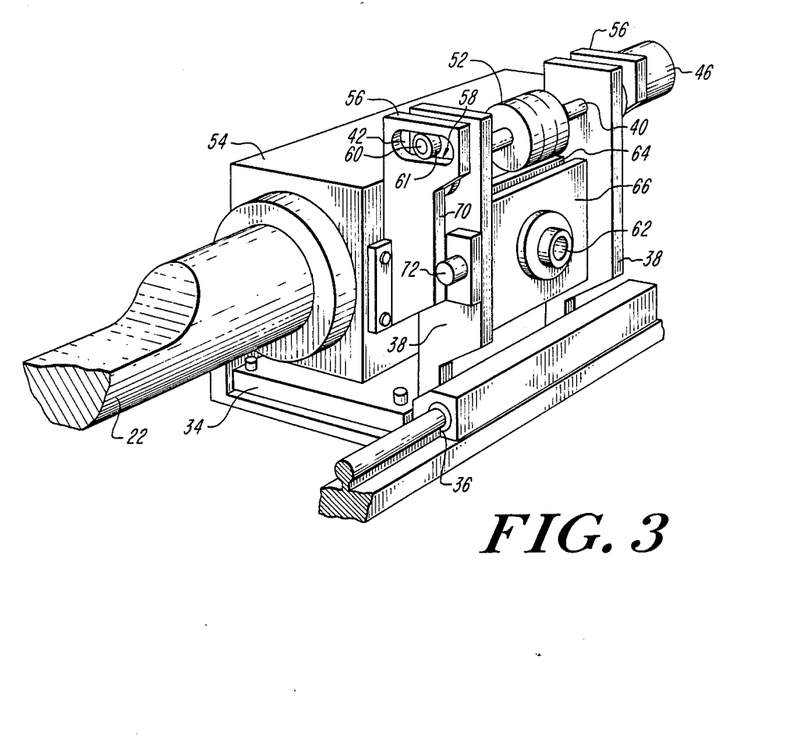
FIG. 3 is a perspective view illustrating the wafer softlanding system of the present invention.
Figure 4:
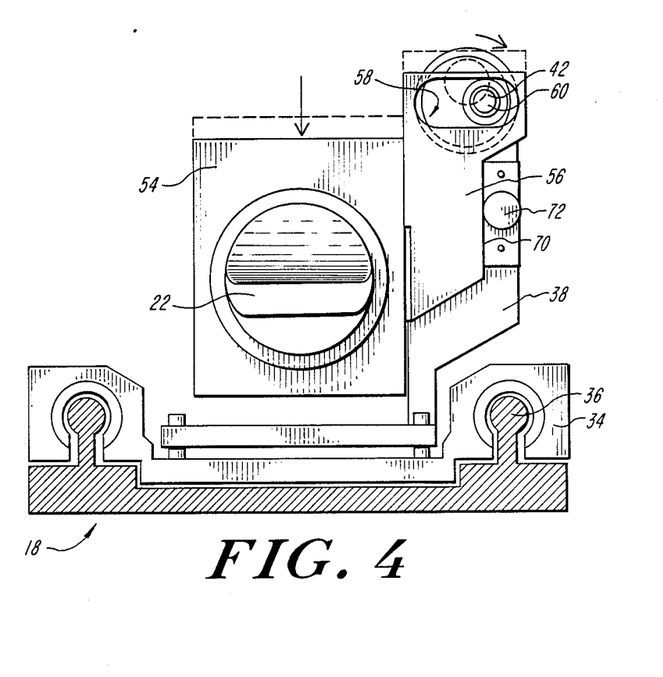
FIG. 4 is a front elevational view, partially in section, of the wafer softlanding system of the present invention.
Figure 5:
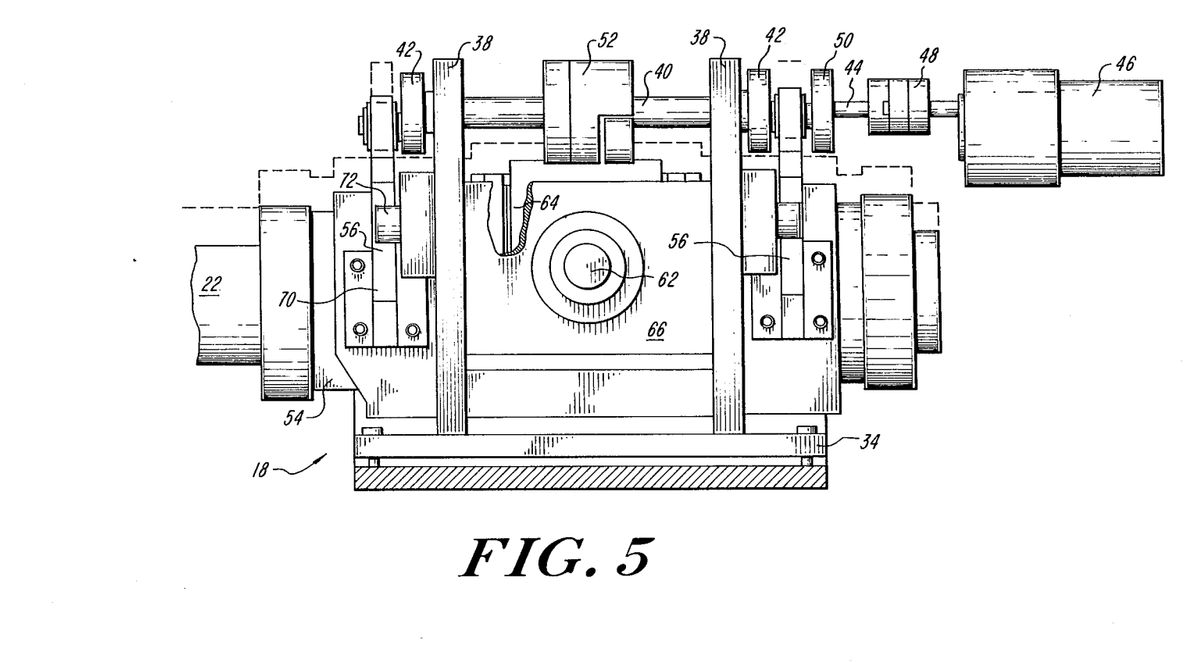
FIG. 5 is a side elevational view, partially in section, of the wafer softlanding system of the present invention.

Referring now to FIGS. 3, 4 and 5, the softlander 18 preferably includes a carriage 34 slidably mounted on linear bearings 36 for reciprocating motion along the X direction. First and second spaced-apart upstanding plates 38 are fastened to the carriage 34. A shaft 40 is journaled for rotation in the upstanding plates 38, and first and second disks 42 (best seen in FIG. 5) are mounted for rotation with the shaft 40 individually confronting a corresponding one of the opposed surfaces of the upstanding plates 38. The shaft 40 is mounted for rotation with the shaft 44 of a motor 46 via a flexible coupling 48 and limit-switch tripping cams 50 (best seen in FIG. 5). A phase adjusting coupling 52 is mounted in the shaft 40 and between the confronting surfaces of the plates 38.

The paddle 22 is slidably received in and removably retained by a housing member 54, and first and second spaced upstanding plates 56 are fastened to the housing 54 individually confronting a corresponding one of the opposed surfaces of the upstanding plates 38 that are fastened to the carriage 34. The upstanding plates 56 each have an elongated slot generally designated 58 therethrough (best seen in FIG. 4) that is elongated in a direction generally transverse the direction of elongation of the upstanding plates. Posts 60 having roller bearing surfaces 61 are eccentrically fastened to the disks 42, and the posts 60 are individually slidably received in corresponding ones of the slots 58. The housing 54, and therewith the cantilevered paddle 22, is thereby suspended off of the upstanding plates 38 fastened to the carriage 34. The relative phase of the eccentric posts 60 is selected to control the pitch of the paddle 22 as it controllably descends and as it controllably ascends.

A shaft 62 is mounted to a linear bearing 64 that is fastened to the housing 54 at a point along its side intermediate the upstanding plates 38 so that it extends in a direction perpendicular to the direction of elongation of the paddle 22. The shaft 62 is journaled for rotation in a plate 66 that is fastened to the confronting surfaces of the upstanding plates 38. The linear bearing 64 accommodates movement of the housing 54 in the Z direction. The shaft 62 journaled in the plate 66 accommodates movement of the housing 54 angularly about the axis of the shaft 62 in the $\theta$ direction.

The plates 56 have linear cam follower bearing surfaces 70, and bearing posts 72 that are fastened to the plates 38 follow the bearing surfaces 70 during Z motion of the housing 54. The bearing surfaces 70 and posts 72 stabilize the assembly during controlled Z and $\theta$ motion.

The coupling 52 is adjusted such that the relative angular position of the posts 60 are in selected phase relation with each other. In the preferred embodiment, the eccentric posts 60 are so phased that the proximate post is in phase lead relation to the distal post for a given angular position of the shaft 40. As the shaft 40 is controllably rotated by the motor 46, the posts 60 thus gang the confronting walls of the slots 58 in such a way that the plates 56 are differentially driven downwardly as can best be seen in FIG. 4. The housing 54 therewith moves vertically downwardly on the linear bearing plate 64, and the housing 54 rotates about the shaft 62 in the θ direction. The cantilevered paddle 22 therewith tilts about the axis of the shaft 62 in the θ direction such that its free end leads its supported end while it undergoes as a whole a vertical displacement downwardly along the Z direction. As described above in connection with the description of FIG. 2, with continued θ and Z motion a batch of wafers to be processed is therewith gently softlanded on the floor of an associated processing tube.

By angularly rotating the motor 46 in the reverse angular direction, the same motion occurs but in reverse. In the latter case, the distal eccentric leads the proximate eccentric such that the supported end of the cantilevered paddle moves vertically before its free end whereby the batch of wafers is gently lifted-off the floor of the processing furnace tube. In the preferred embodiment, it may be noted that a typical displacement in the vertical direction is about three-fourths of an inch, that a typical rotation of the shaft of the motor typically subtends less than 180! of arc, and that the pitch of the paddle is controllable approximately between 0 minute to +3 minute of arc. The limit switch tripping cams control the end points of angular travel of the shaft. It will be noted that the eccentrics can be selectively phased to provide any controlled θ and Z motion without departing from the inventive concept.

Figure 6:
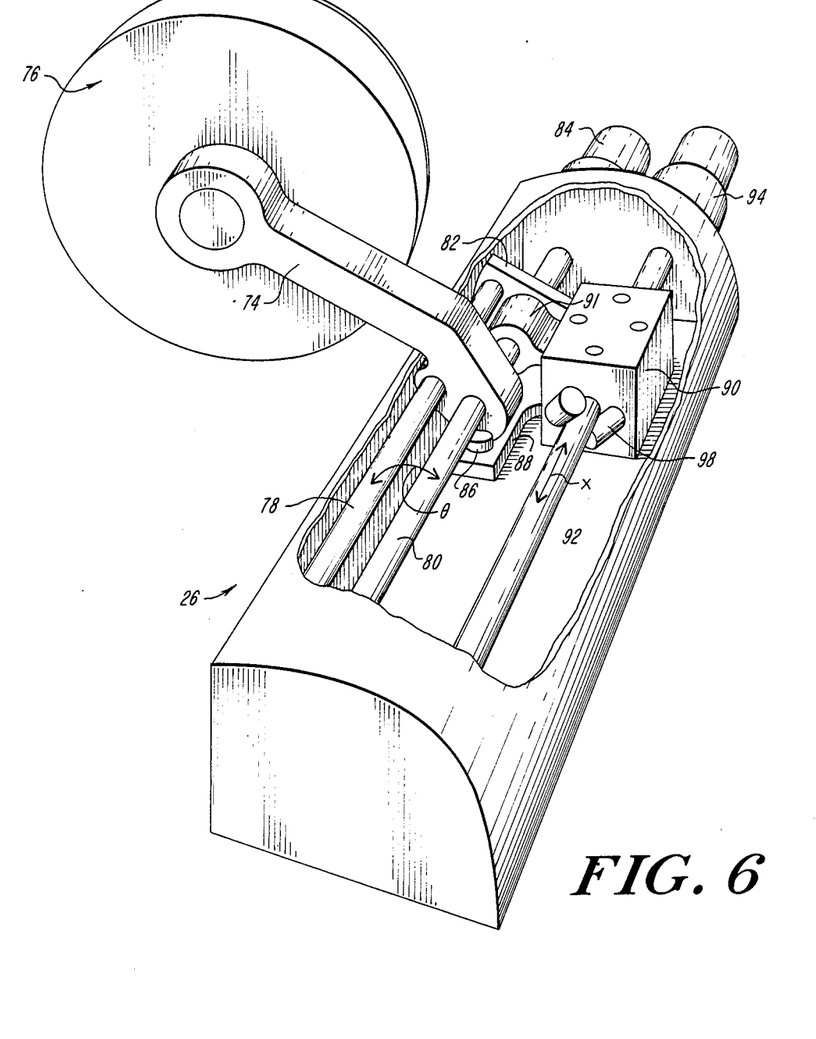
FIG. 6 is a perspective view of the cooperative door assembly of the present invention.
Figure 7:
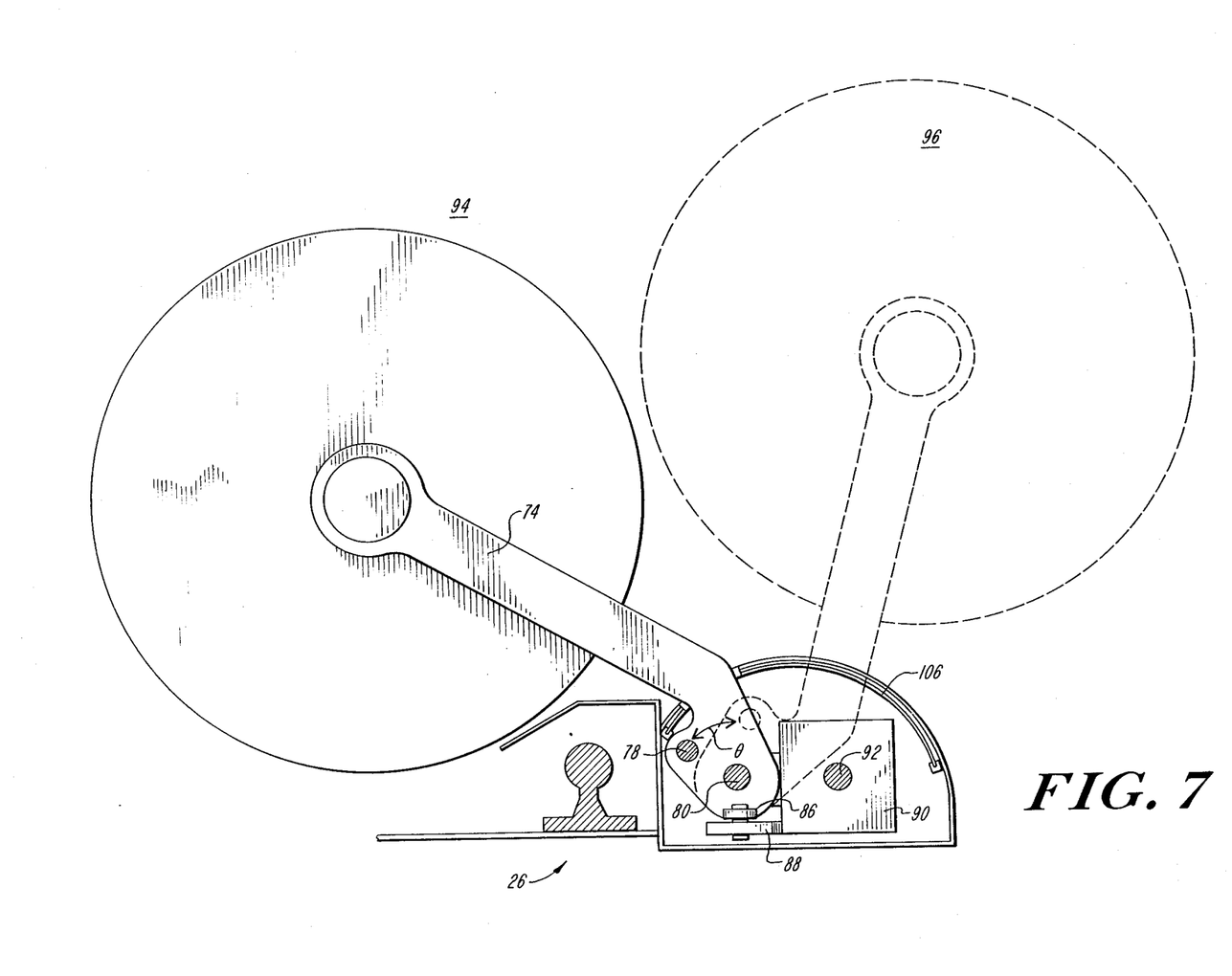
FIG. 7 is a partially schematic sectional view of the door assembly of the present invention.
Figure 8A:
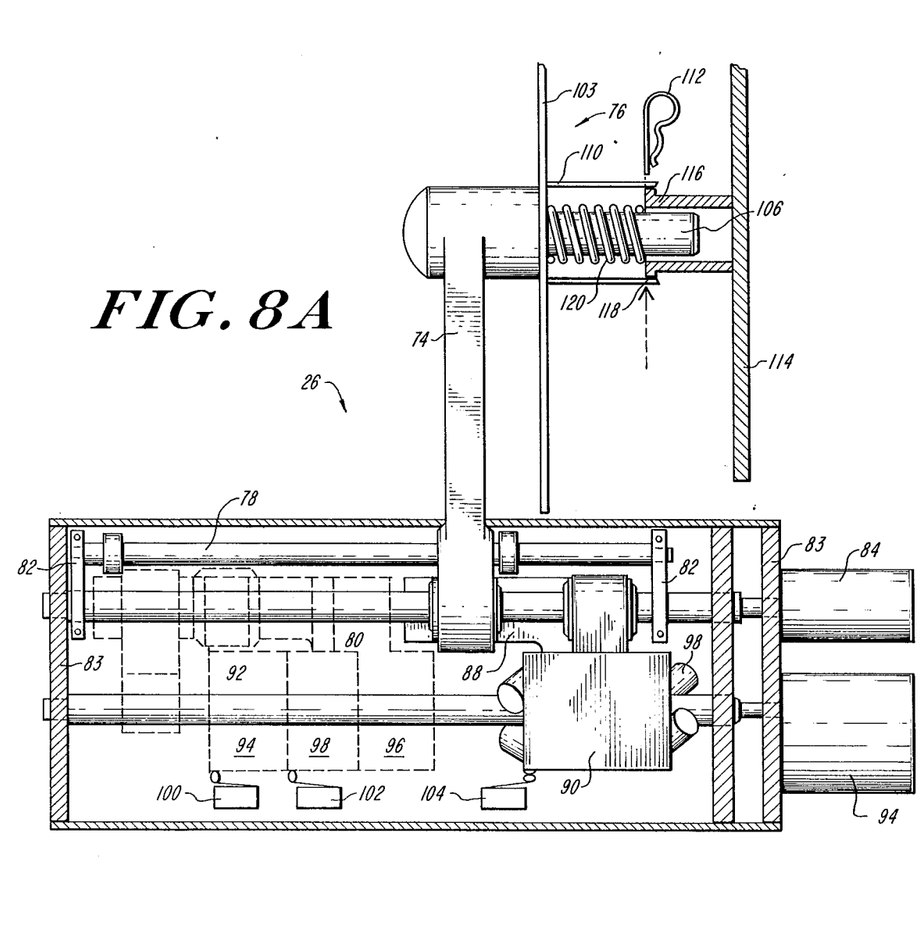

Referring now to FIGS. 6-8A, the door assembly 26 includes an arm 74. A closure member generally designated 76 to be described is fastened to the arm 74. The arm 74 is slidably mounted on a pair of parallel shafts 78, 80 that are fastened to a pair of spaced-apart stabilizing and tie plates 82. The shaft 80 is journaled for rotation in spaced apart plates 83 and is mounted for rotation with the shaft of a motor 84 as best seen in FIG. 8A. With the rotation of the motor 84 the shaft 80 rotates, and therewith the stabilizing and tie plates 82 pivot about the axis of the shaft 80 moving the door assembly 76 clockwise from its closed position to the open position illustrated in dashed line in FIG. 7. It will be appreciated that any other suitable means for pivoting the door 74 in response to rotation of the shaft of the motor 84, such as a rectangular shaft, can be employed as well without departing from the inventive concept.

The arm 74 on its end remote from the door closure member 76 is received between two upstanding posts 86 that are fastened to a leg 88. The leg 88 is fastened to a slide 90 that is slidably mounted on a shaft 92 mounted for rotation by a X motor 94. A stabilizing annulus 91 fastened to the slide 90 is mounted for sliding motion along the shaft 80. Although any suitable means for converting the rotary motion of the shaft 92 into translating motion of the slide 90 may be employed, a so-called ROHLIX drive 98 is preferred insofar as this type of drive slips when its motion is resisted, such as when the closure member 76 hits an abutment or otherwise is impeded in its controlled motion so that any damage that could otherwise result from overtravel thereof is thereby substantially eliminated.

As best seen in FIGS. 1, 7, and 8A, the door assembly 26 preferably has three positions. A first outboard position designated 94 and illustrated in FIGS. 1 and 7 is provided where the door assembly 76 is located laterally outwardly adjacent and axially spaced from a corresponding mouth 14 of a furnace tube so as to allow the paddle 22 free and unimpeded ingress thereinto and egress thereout. An inboard second position designated 96 and illustrated in FIGS. 7 and 8A is provided where the door assembly 26 is rotated inwardly and is axially confronting the processing furnace tube so as to provide a closure of the corresponding mouth 14. An axially and rotationally intermediate position designated 98 and illustrated in FIG. 8A is provided to allow the door to move between its outboard and its inboard positions 94, 96. Axial position sensors 100, 102, 104 are responsive to the location of the arm along the X direction to control the motion of the door assembly. A cover 106 (FIG. 7) is slidably mounted in the door assembly 26 to prevent dirt, dust, and other contaminants from penetrating into and jamming or otherwise interferring with the action of the door assembly as it is controllably moved between its three positions.

As shown in FIG. 8A, a first embodiment of the closure member 76 of the door assembly 26 includes a shaft 106 generally perpendicular to and mounted for rotation with the arm 74. A scavenger shield 103, preferably of stainless steel, is fastened to the arm 76 and concentric with the shaft 106, and an annulus 110 is provided surrounding and spaced from the shaft 106. A process tube closure 114, preferably fashioned of quartz, is provided with an annulus 116 that terminates in a radially outwardly extending flange 118. The annulus 116 is slidably mounted around the shaft 106 and within the annulus 110. A removable abutment such as a pin 112 is slidably mounted through an aperture, not shown, provided therefore in the peripheral wall of the annulus 110 that abuts and limits the travel of the flange 118 of the annulus 116. A spring 120 slidably mounted on the shaft 106 bears against the flange 118 and urges the members 112, 118 into abutment. The closure 114 thereby is allowed to flex about the shaft 106, which is advantageous insofar as this feature eliminates the need for a precise stopping position control while providing a self-seating action. The closure member 114 is able to be readily removably replaced simply by removing and replacing the pins 112, and different size closures for different size process tubes can thereby be readily accommodated. As will be appreciated by those skilled in the art, the embodiment of the door shown in FIG. 8A is particularly useful for processing furnace tubes running atmospheric processes.

Figure 8B:
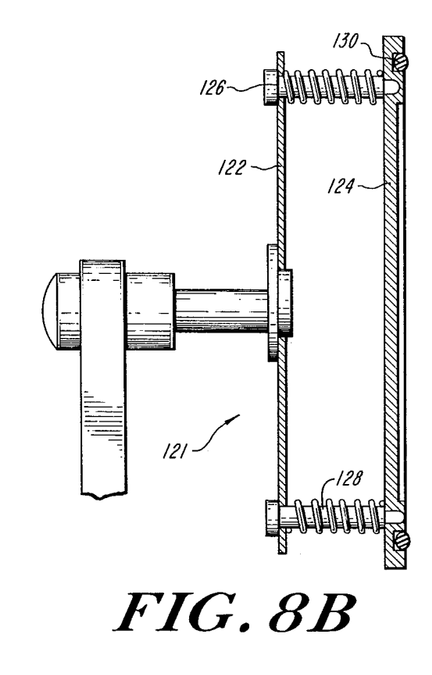

Referring now to FIG. 8B, generally shown at 121 is a door assembly particularly well-suited for vacuum processes. The door 121 includes a plate 122 mounted for rotation with the arm 76. A vacuum door tube closure 124 is mounted in spaced relation to the member 122 on elongated headed fasteners 126 slidably mounted in apertures provided therefore in the door 122 such that their enlarged heads abut the member 126 and their other ends are threadably fastened to the vacuum tube closure 124. Springs 128 are slidably mounted on the fasteners 126 for urging the door 124 away from the member 122. A sealing ring 130 is mounted in an annular recess provided therefor in the tube closure 124 for providing an air-tight seal with the mouth of the processing furnace tube. The tube closure 124 in the embodiment of FIG. 8B, as in the embodiment of the closure of FIG. 8A, is able to flex, which eliminates the need for precise stopping position control, and provides a self-seating action. The closure 124 is readily replaceable by the action of the fasteners 126.

The softlanding system of the present invention in the way that the paddle is tilted during lifting makes possible the gentle removal of wafers off of the floor of the furnace tube that may be stuck thereto as by coating bridges without generating any significant levels of particulates. The lifting motion is itself gentle, and it pries the support off of the floor in a controlled wedge-like manner. Because of the gentle prying release of the support, vibration in the paddle is reduced and in such a way that wafer movement is minimized. Any particulate generation that would otherwise be induced by a large vibration is thereby substantially circumvented.

The paddle itself is not present in the thermal reaction chamber during processing. The lower thermal mass in the processing furnace tube results in quicker thermal recovery. An improved intrachamber gas flow and the possibility for more flexible quartzware design are further advantages that attend the absence of the paddle during processing.

The cooperative door assembly that maintains the closure member at the mouth of the processing furnace tubes results in cleaner furnaces, no unwanted contaminants being admitted thereto. Further, the door assembly acts to better maintain the intended pressure and other conditions in the processing furnace tubes, and results in more uniform system operation.

Many modifications of the presently disclosed invention will become apparent to those skilled in the art without departing from the scope of the appended claims.

What is claimed is:

1. A wafer softlanding system for a processing furnace tube having a bottom and in which a furnace load of wafers is loaded during a load cycle and removed therefrom during an unload cycle, comprising:
    an elongated paddle having ends that defines an X direction along the direction of elongation of said paddle for receiving plural wafers to be processed in said processing furnace tube;
    a support;
    means coupled to said support for mounting said paddle to said support in a cantilevered fashion defining a remote and a mounted end;
    pivot means coupled to said support and cooperative with said mounting means for providing clockwise and counterclockwise $\theta$ movement of said cantilevered paddle about a $\theta$ axis; and
    combination phase determining and paddle raising/lowering means cooperative with said pivot means for selectively effecting a predetermined phased rotation of said ends of, and a raising/lowering in a Z direction of, said elongated paddle, said predetermined phased rotation being selectively adjustable to cause either end of said elongated paddle to lead the other end of the paddle selectively during the load cycle so that if in one case said mounted end leads the remote end during load, said elongated paddle rotates in said $\theta$ direction to lower the paddle in such a way that the mounted end approaches the bottom first with the remote end of the paddle lagging behind and approaching the bottom later, and if in the other case said remote end leads the mounted end during load, said elongated paddle rotates in said $\theta$ direction to lower the paddle in such a way that the remote end approaches the bottom first with the mounted end of the paddle lagging behind and approaching the bottom later, so that in both cases the corresponding end of the furnace load of wafers is thereby made to first softly contact the bottom in said processing furnace tube prior to the other end of said furnace load of wafers and in such a way that the cantilevered paddle is able to translate as a whole in said Z direction while it is able to rotate about said $\theta$ axis remaining always in spaced relation to the bottom of the tube and without contacting bottom in said processing furnace tube.

2. The softlander of claim 1, wherein said paddle mounting means includes a saddle housing for receiving said mounted end of said elongated paddle such that said remote end thereof extends therefrom in said cantilevered fashion.

3. The softlander of claim 1, wherein said $\theta$ axis is located intermediate said ends of said cantilevered paddle in said X direction to effect said clockwise and counterclockwise $\theta$ movement of said ends of said cantilevered paddle.

4. The softlander of claim 2, wherein said support includes a base plate, and first and second plates spaced from each other and individually fastened to and upstanding from said base plate, and wherein said saddle includes third and fourth upstanding plates fastened thereto and so spaced from each other as to individually confront a corresponding one of said first and second upstanding plates, and wherein said mounting means includes means coupled between said confronting ones of said first, second, third and fourth plates for hanging said third and said fourth plates to said first and said second plates, respectively.

5. The softlander of claim 4, wherein said means for effecting clockwise and counterclockwise $\theta$ movement of said ends of said cantilevered paddle includes first and second eccentrics, respectively, coupled between said confronting ones of said first, second, third and fourth upstanding plates.

6. The softlander of claim 5, wherein said means for effecting clockwise and counterclockwise $\theta$ movement of said ends of said cantilevered paddle further includes a first shaft journaled to said first and said second upstanding plates, and wherein said first and said second eccentrics are mounted for rotation with said first shaft.

7. The wafer softlander of claim 6, wherein said means for effecting clockwise and counterclockwise $\theta$ movement of said ends of said cantilevered paddle includes means coupled to said first shaft for adjusting said predetermined phased rotation of said first and said second eccentrics relative to an angular orientation of said first shaft.

8. The wafer softlander of said claim 7, wherein said predetermined phased rotation of said eccentrics controls the clockwise and counterclockwise rotation of said ends of said elongated paddle in a $\theta$ direction.

9. The wafer softlander of claim 4, wherein said means for effecting clockwise and counterclockwise $\theta$ movement of said ends of said cantilevered paddle further includes a linear bearing plate assembly fastened to said saddle and mounted for reciprocating motion between said first and said second upstanding plates along said Z direction.

10. The wafer softlander of claim 9, wherein said means for effecting clockwise and counterclockwise $\theta$ movement of said ends of said cantilevered paddle includes a second shaft fastened to said saddle and fastened to said linear bearing plate assembly.

11. A wafer softlanding system for a processing furnace tube, comprising:
    an elongated paddle that defines an X direction along the direction of elongation of said paddle for receiving plural wafers to be processed in said processing furnace tube;
    a support;

means coupled to said support for mounting said paddle to said support in a cantilevered fashion, said paddle mounting means including a saddle housing for receiving an end of said paddle such that the other end thereof extends therefrom in said cantilevered fashion;

wherein said support includes a base plate, further includes first and second plates spaced from each other and individually fastened to and upstanding from said base plate, wherein said saddle includes third and fourth upstanding plates fastened thereto and so spaced from each other as to individually confront a corresponding one of said first and second upstanding plates, and wherein said mounting means includes means coupled between said confronting ones of said first, second, third and fourth plates for hanging said third and said fourth plates to said first and said second plates respectively; and means coupled to said support and cooperative with said mounting means for selectively pushing and pulling preselected portions of said cantilevered paddle selected to be spaced apart along said X direction so that the cantilevered paddle is able to translate as a whole in Z while it is able to rotate about a $\theta$ axis.

12. The softlander of claim 11, wherein said selectively pushing and pulling means includes first and second eccentrics respectively coupled between said confronting ones of said first second, third and fourth upstanding plates.

13. The softlander of claim 12, wherein said selectively pushing and pulling means further includes a first shaft journaled to said first and said second upstanding plates, and wherein said first and said second eccentrics are mounted for rotation with said first shaft.

14. The wafer softlander of claim 13, wherein said selectively pushing and pulling means includes means coupled to said first shaft for adjusting the phase of said first and said second eccentrics relative to the angular orientation of said first shaft.

15. The wafer softlander of claim 14, wherein said relative phase of said eccentrics controls the tilting of said paddle in $\theta$ about said axis.

16. The wafer softlander of claim 11, wherein said selectively pushing and pulling means further includes a linear bearing plate assembly fastened to said saddle and mounted for reciprocating motion between said first and said second upstanding plates along said Z direction.

17. The wafer softlander of claim 16, wherein said selectively pushing and pulling mounting means includes a second shaft fastened to said saddle and fastened to said linear bearing plate assembly.

* * * * *